(12) United States Patent
Chen

(10) Patent No.: US 8,588,020 B2
(45) Date of Patent: Nov. 19, 2013

(54) SENSE AMPLIFIER AND METHOD FOR DETERMINING VALUES OF VOLTAGES ON BIT-LINE PAIR

(75) Inventor: Shi-Wen Chen, Kaohsiung (TW)

(73) Assignee: United Microelectronics Corporation, Hsinchu (TW)

( * ) Notice: Subject to any disclaimer, the term of this patent is extended or adjusted under 35 U.S.C. 154(b) by 232 days.

(21) Appl. No.: 13/297,362

(22) Filed: Nov. 16, 2011

(65) Prior Publication Data

US 2013/0124905 A1    May 16, 2013

(51) Int. Cl.
*G11C 7/02*    (2006.01)

(52) U.S. Cl.
USPC .......................................................... 365/207

(58) Field of Classification Search
USPC .......................................... 365/207; 713/500
See application file for complete search history.

(56) References Cited

U.S. PATENT DOCUMENTS

| | | | |
|---|---|---|---|
| 3,663,828 A | 5/1972 | Low | |
| 3,818,402 A | 6/1974 | Golaski | |
| 4,163,944 A | 8/1979 | Chambers | |
| 4,245,355 A | 1/1981 | Pascoe | |
| 4,409,608 A | 10/1983 | Yoder | |
| 4,816,784 A | 3/1989 | Rabjohn | |
| 4,984,196 A | 1/1991 | Tran et al. | |
| 5,159,205 A | 10/1992 | Gorecki | |
| 5,208,725 A | 5/1993 | Akcasu | |
| 5,212,653 A | 5/1993 | Tanaka | |
| 5,227,998 A * | 7/1993 | Voss ............................. | 365/194 |
| 5,289,415 A | 2/1994 | DiMarco et al. | |
| 5,406,447 A | 4/1995 | Miyazaki | |
| 5,446,309 A | 8/1995 | Adachi | |
| 5,534,800 A | 7/1996 | Hiraki et al. | |
| 5,546,338 A * | 8/1996 | Proebsting .................... | 365/181 |
| 5,583,359 A | 12/1996 | Ng | |
| 5,637,900 A | 6/1997 | Ker | |
| 5,760,456 A | 6/1998 | Grzegorek | |
| 5,808,330 A | 9/1998 | Rostoker | |
| 5,923,225 A | 7/1999 | De Los Santos | |
| 5,945,862 A * | 8/1999 | Donnelly et al. ............. | 327/278 |
| 5,959,820 A | 9/1999 | Ker | |
| 6,008,102 A | 12/1999 | Alford | |
| 6,081,146 A | 6/2000 | Shiochi | |
| 6,172,378 B1 | 1/2001 | Hull | |
| 6,181,621 B1 | 1/2001 | Lovett | |
| 6,194,739 B1 | 2/2001 | Ivanov | |

(Continued)

OTHER PUBLICATIONS

Song et al., "A Robust Latch-Type Sense Amplifier Using Adaptive Latch Resistance", pp. 182-185, 2010, IEEE.

(Continued)

*Primary Examiner* — Paul R Myers
(74) *Attorney, Agent, or Firm* — WPAT, PC; Justin King

(57) ABSTRACT

A sense amplifier and a method for determining the values of the voltages on a bit-line pair are provided. The sense amplifier comprises a first delay chain and a second delay chain. The first delay chain is electrically connected to a bit line and configured for receiving a clock signal and a first voltage on the bit line, so as to delay the clock signal according to the first voltage and to generate a first delay signal accordingly. The second delay chain is electrically connected to a complementary bit line and configured for receiving the clock signal and a second voltage on the complementary bit line, so as to delay the clock signal according to the second voltage and to generate a second delay signal accordingly.

12 Claims, 7 Drawing Sheets

(56) References Cited

U.S. PATENT DOCUMENTS

| | | |
|---|---|---|
| 6,246,271 B1 * | 6/2001 | Takada et al. ............... 327/116 |
| 6,255,878 B1 * | 7/2001 | Gauvin et al. ............... 327/263 |
| 6,285,578 B1 | 9/2001 | Huang |
| 6,291,872 B1 | 9/2001 | Wang |
| 6,370,372 B1 | 4/2002 | Molnar |
| 6,407,412 B1 | 6/2002 | Iniewski |
| 6,427,226 B1 | 7/2002 | Mallick |
| 6,448,858 B1 | 9/2002 | Helms |
| 6,452,442 B1 | 9/2002 | Laude |
| 6,456,221 B2 | 9/2002 | Low |
| 6,461,914 B1 | 10/2002 | Roberts |
| 6,480,137 B2 | 11/2002 | Kulkarni |
| 6,483,188 B1 | 11/2002 | Yue |
| 6,486,765 B1 | 11/2002 | Katayanagi |
| 6,509,805 B2 | 1/2003 | Ochiai |
| 6,518,165 B1 | 2/2003 | Yoon |
| 6,521,939 B1 | 2/2003 | Yeo |
| 6,545,547 B2 | 4/2003 | Fridi |
| 6,560,306 B1 | 5/2003 | Duffy |
| 6,588,002 B1 | 7/2003 | Lampaert |
| 6,593,838 B2 | 7/2003 | Yue |
| 6,597,626 B2 * | 7/2003 | Hirabayashi ............... 365/233.1 |
| 6,603,360 B2 | 8/2003 | Kim |
| 6,608,363 B1 | 8/2003 | Fazelpour |
| 6,611,223 B2 | 8/2003 | Low |
| 6,625,077 B2 | 9/2003 | Chen |
| 6,630,897 B2 | 10/2003 | Low |
| 6,639,298 B2 | 10/2003 | Chaudhry |
| 6,653,868 B2 | 11/2003 | Oodaira |
| 6,668,358 B2 | 12/2003 | Friend |
| 6,700,771 B2 | 3/2004 | Bhattacharyya |
| 6,717,877 B2 * | 4/2004 | Suzuki et al. ............. 365/210.12 |
| 6,720,608 B2 | 4/2004 | Lee |
| 6,724,677 B1 | 4/2004 | Su |
| 6,756,656 B2 | 6/2004 | Lowther |
| 6,795,001 B2 | 9/2004 | Roza |
| 6,795,372 B2 * | 9/2004 | Kim et al. ............... 365/230.06 |
| 6,796,017 B2 | 9/2004 | Harding |
| 6,798,011 B2 | 9/2004 | Adan |
| 6,798,704 B2 | 9/2004 | Chen et al. |
| 6,810,242 B2 | 10/2004 | Molnar |
| 6,822,282 B2 | 11/2004 | Randazzo |
| 6,822,312 B2 | 11/2004 | Sowlati |
| 6,833,756 B2 | 12/2004 | Ranganathan |
| 6,841,847 B2 | 1/2005 | Sia |
| 6,847,572 B2 | 1/2005 | Lee |
| 6,853,272 B1 | 2/2005 | Hughes |
| 6,876,056 B2 | 4/2005 | Tilmans |
| 6,885,534 B2 | 4/2005 | Ker |
| 6,901,126 B1 | 5/2005 | Gu |
| 6,905,889 B2 | 6/2005 | Lowther |
| 6,909,149 B2 | 6/2005 | Russ |
| 6,927,664 B2 | 8/2005 | Nakatani |
| 6,958,522 B2 | 10/2005 | Clevenger |
| 7,009,252 B2 | 3/2006 | Lin |
| 7,027,276 B2 | 4/2006 | Chen |
| 7,095,665 B2 * | 8/2006 | Song ............... 365/205 |
| 7,205,612 B2 | 4/2007 | Cai |
| 7,262,069 B2 | 8/2007 | Chung |
| 7,365,627 B2 | 4/2008 | Yen |
| 7,368,761 B1 | 5/2008 | Lai |
| 7,376,026 B2 * | 5/2008 | Vollrath et al. ............... 365/201 |
| 7,379,355 B2 * | 5/2008 | Kim et al. ............... 365/194 |
| 7,405,642 B1 | 7/2008 | Hsu |
| 7,642,866 B1 * | 1/2010 | Masleid ............... 331/57 |
| 7,672,100 B2 | 3/2010 | Van Camp |
| 7,746,714 B2 * | 6/2010 | Lee ............... 365/207 |
| 7,764,557 B2 * | 7/2010 | Kim ............... 365/207 |
| 7,795,927 B2 * | 9/2010 | Farwell ............... 327/34 |
| 2002/0019123 A1 | 2/2002 | Ma |
| 2002/0036545 A1 | 3/2002 | Fridi |
| 2002/0188920 A1 | 12/2002 | Lampaert |
| 2003/0076636 A1 | 4/2003 | Ker |
| 2003/0127691 A1 | 7/2003 | Yue |
| 2003/0183403 A1 | 10/2003 | Kluge |
| 2003/0218481 A1 | 11/2003 | Wicht et al. |
| 2005/0068112 A1 | 3/2005 | Glenn |
| 2005/0068113 A1 | 3/2005 | Glenn |
| 2005/0087787 A1 | 4/2005 | Ando |
| 2006/0006431 A1 | 1/2006 | Jean |
| 2006/0108694 A1 | 5/2006 | Hung |
| 2006/0267102 A1 | 11/2006 | Cheng |
| 2007/0097765 A1 | 5/2007 | Huang et al. |
| 2007/0102745 A1 | 5/2007 | Hsu |
| 2007/0210416 A1 | 9/2007 | Hsu |
| 2007/0234554 A1 | 10/2007 | Hung |
| 2007/0246801 A1 | 10/2007 | Hung |
| 2007/0249294 A1 | 10/2007 | Wu |
| 2007/0296055 A1 | 12/2007 | Yen |
| 2008/0094166 A1 | 4/2008 | Hsu |
| 2008/0185679 A1 | 8/2008 | Hsu |
| 2008/0189662 A1 | 8/2008 | Nandy |
| 2008/0200132 A1 | 8/2008 | Hsu |
| 2008/0203998 A1 * | 8/2008 | Jenkins ............... 324/76.41 |
| 2008/0299738 A1 | 12/2008 | Hsu |
| 2008/0303623 A1 | 12/2008 | Hsu |
| 2009/0029324 A1 | 1/2009 | Clark |
| 2009/0201625 A1 | 8/2009 | Liao |
| 2010/0279484 A1 | 11/2010 | Wang |

OTHER PUBLICATIONS

Hourieh Attarzadeh et al., "A Scalable Offset-Cancelled Current/Voltage Sense Amplifier", pp. 3853-3856, 2010, IEEE.

Kushida et al., "A 0.7 V Single-Supply SRAM With 0.495 $\mu m^2$ Cell in 65 nm Technology Utilizing Self-Write-Back Sense Amplifier and Cascaded Bit Line Scheme", vol. 44, pp. 1192-1198, Apr. 2009, IEEE Journal of Solid-State Circuits.

* cited by examiner

SENSE AMPLIFIER AND METHOD FOR DETERMINING VALUES OF VOLTAGES ON BIT-LINE PAIR

FIELD OF THE INVENTION

The present invention relates to the field of the memory, and more particularly to a sense amplifier for a memory and a method for determining the values of the voltages on a bit-line pair.

BACKGROUND OF THE INVENTION

For the current memories, some employ the analog sense amplifier to perform the amplifying operation on signals on the bit-line pair. The analog sense amplifier has its advantages since its operation speed is fast. However, the analog sense amplifier is implemented by the differential amplifier, and thus it usually has the problem that the threshold voltages (Vth) of transistors are different because of the manufacturing problem (i.e., the mismatching problem), so that the analog sense amplifier has a disadvantage of voltage offsetting.

In addition, some memories employ the digital sense amplifier to perform the amplifying operation on signals. However, the digital sense amplifier must operate in full swing, thus it has a disadvantage of low operation speed.

SUMMARY OF THE INVENTION

The present invention relates to a sense amplifier. The operation speed of the sense amplifier is fast, and the problem of its voltage offsetting is little.

The present invention also relates to a method for determining the values of the voltages on a bit-line pair, which is suitable for the above-mentioned sense amplifier.

The present invention provides a sense amplifier for a random access memory, which comprises a first delay chain and a second delay chain. The first delay chain is electrically connected to a bit line and is configured for receiving a clock signal and a first voltage on the bit line, so as to delay the clock signal according to the first voltage and to generate a first delay signal accordingly. The second delay chain is electrically connected to a complementary bit line and is configured for receiving the clock signal and a second voltage on the complementary bit line, so as to delay the clock signal according to the second voltage and to generate a second delay signal accordingly.

The present invention also provides a method for determining the values of the voltages on a bit-line pair, which comprises the following steps: delaying a clock signal according to a first voltage on a bit line and generating a first delay signal accordingly, and delaying the clock signal according to a second voltage on a complementary bit line and generating a second delay signal accordingly; and determining which one of the first voltage and the second voltage is larger according to a phase relation between the first delay signal and the second delay signal.

The present invention employs two delay chains to convert the values of the voltages on a bit line and a complementary bit line into phase delays. Therefore, a user can determine which one of the voltages on the bit line and the complementary bit line is larger according to the phase relation between the first delay signal and the second delay signal. The larger the voltage is, the smaller the delay is. Thus, when the phase of the first delay signal leads that of the second delay signal, it can determine that the voltage on the bit line is larger than the voltage on the complementary bit line. On the contrary, when the phase of the second delay signal leads that of the first delay signal, it can determine that the voltage of the complementary bit line is larger than the voltage on the bit line.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
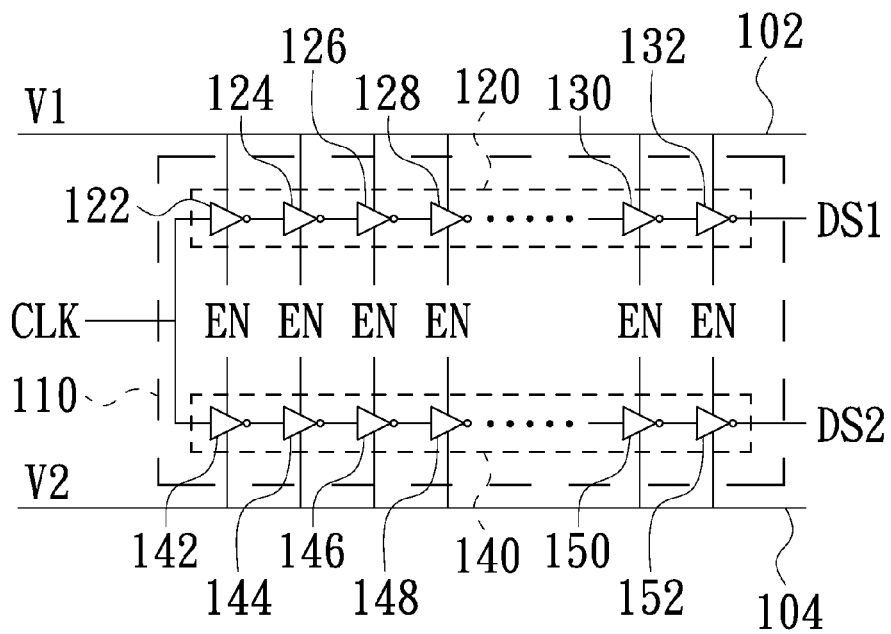
FIG. 1 is a schematic view of a sense amplifier in accordance with an exemplary embodiment of the present invention.

FIG. 1 is a schematic view of a sense amplifier in accordance with an exemplary embodiment of the present invention. The sense amplifier 110 is suitable for a memory such as a random access memory (RAM). Referring to FIG. 1, the sense amplifier 110 is configured for being electrically connected to a bit-line pair consisting of a bit line 102 and a complementary bit line 104. In the exemplary embodiment, the sense amplifier 110 comprises delay chains 120 and 140, and each of the delay chains comprises even inverters (as indicated by labels 122-132 and 142-152).

The delay chain 120 is configured for being electrically connected to the bit line 102 and is configured for receiving a clock signal CLK and a voltage V1 on the bit line 102, so as to delay the clock signal CLK according to the voltage V1 and to generate a delay signal DS1 accordingly. The delay chain 140 is configured for being electrically connected to the complementary bit line 104 and is configured for receiving the clock signal CLK and a voltage V2 on the complementary bit line 104, so as to delay the clock signal CLK according to the voltage V2 and to generate a delay signal DS2 accordingly. In addition, in the exemplary embodiment, each of the inverters receives a read-enable signal EN configured for performing the reading and controlling operation.

Figure 2:
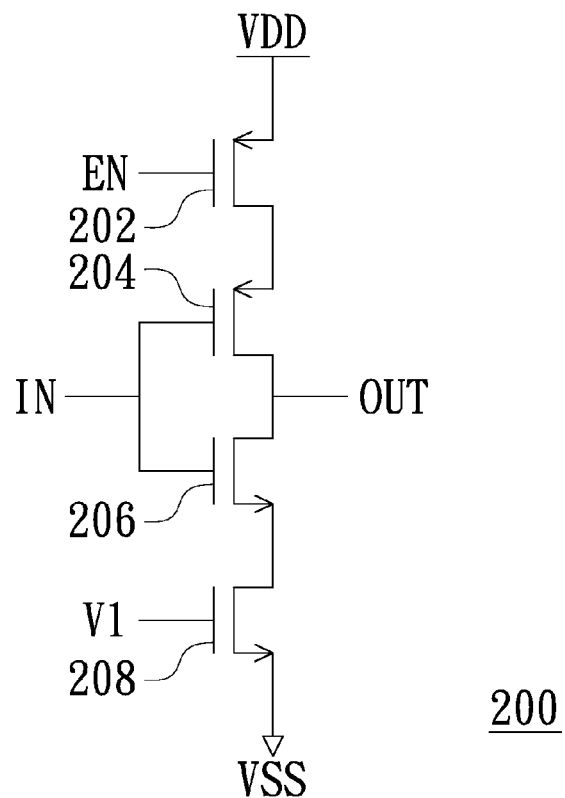
FIG. 2 is a schematic view for showing a circuit structure of an inverter of a delay chain 120 in accordance with an exemplary embodiment of the present invention.

FIG. 2 is a schematic view for showing a circuit structure of an inverter of the delay chain 120 in accordance with an exemplary embodiment of the present invention. Referring to FIG. 2, the inverter 200 comprises two P-type transistors (as indicated by labels 202 and 204 respectively) and two N-type transistors (as indicated by labels 206 and 208 respectively). A source/drain terminal of the P-type transistor 202 is electrically connected to a power-supply voltage VDD, and a gate terminal of the P-type transistor 202 is configured for receiving the read-enable signal EN. A source/drain terminal of the P-type transistor 204 is electrically connected to the other source/drain terminal of the P-type transistor 202, a gate terminal of the P-type transistor 204 is served as an input terminal of the inverter 200 to receive an input signal IN, and the other source/drain terminal of the P-type transistor 204 is served as an output terminal of the inverter 200 to provide an output signal OUT.

In addition, a source/drain terminal of the N-type transistor 206 is electrically connected to the other source/drain terminal of the P-type transistor 204, and a gate terminal of the N-type transistor 206 is electrically connected to the gate terminal of the P-type transistor 204. A source/drain terminal of the N-type transistor 208 is electrically connected to the other source/drain terminal of the N-type transistor 206, a gate terminal of the N-type transistor 208 is configured for receiving the voltage V1 (i.e., the voltage on the bit line 102), and the other source/drain terminal of the N-type transistor 208 is electrically connected to a reference voltage VSS. From the circuit structure as shown in FIG. 2, it can be seen that the larger the value of the voltage V1 is, the faster the charging/discharging speed of a voltage on the output terminal of the inverter 200 is.

Figure 3:
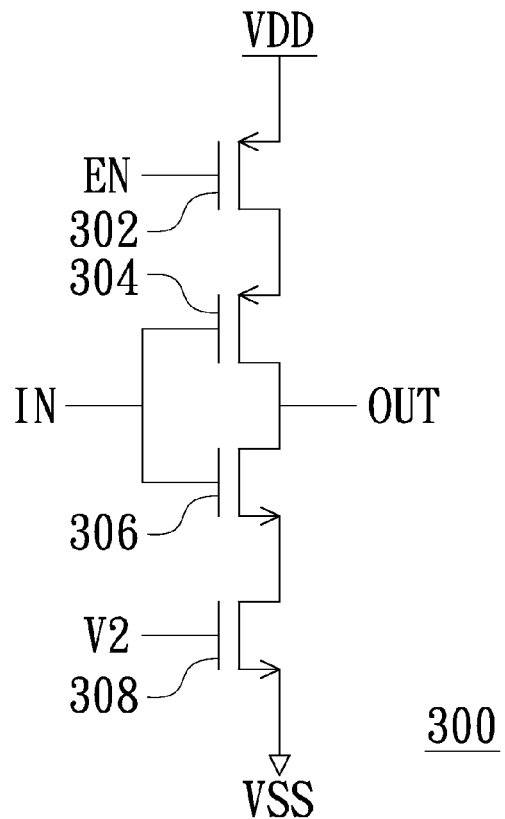
FIG. 3 is a schematic view for showing a circuit structure of an inverter of a delay chain 140 in accordance with an exemplary embodiment of the present invention.

FIG. 3 is a schematic view for showing a circuit structure of an inverter of the delay chain 140 in accordance with an exemplary embodiment of the present invention. Referring to FIG. 3, the inverter 300 also comprises two P-type transistors (as indicated by labels 302 and 304 respectively) and two N-type transistors (as indicated by labels 306 and 308 respectively). From FIG. 3, it can be seen that the circuit structure of the inverter 300 is similar to that of the inverter 200 except that a gate terminal of the N-type transistor 308 of the inverter 300 is configured for receiving the voltage V2 (i.e., the voltage on the complementary bit line 104). From the circuit structure as shown in FIG. 3, it can be seen that the larger the value of the voltage V2 is, the faster the charging/discharging speed of a voltage on the output terminal of the inverter 300 is.

Referring to FIG. 1, since the charging/discharging speed of the voltage on the output terminal of each of the inverters of the delay chain 120 is determined by the value of the voltage V1, and the charging/discharging speed of the voltage on the output terminal of each of the inverters of the delay chain 140 is determined by the value of the voltage V2, the delay degree of the delay signal DS1 outputted by the delay chain 120 is different from that of the delay signal DS2 outputted by the delay chain 140 if the voltages V1 and V2 are different. Therefore, a back-end circuit can determine which one of the voltages V1 and V2 is larger according to the delay degrees of the delay signals DS1 and DS2, which will be described by FIG. 4.

Figure 4:
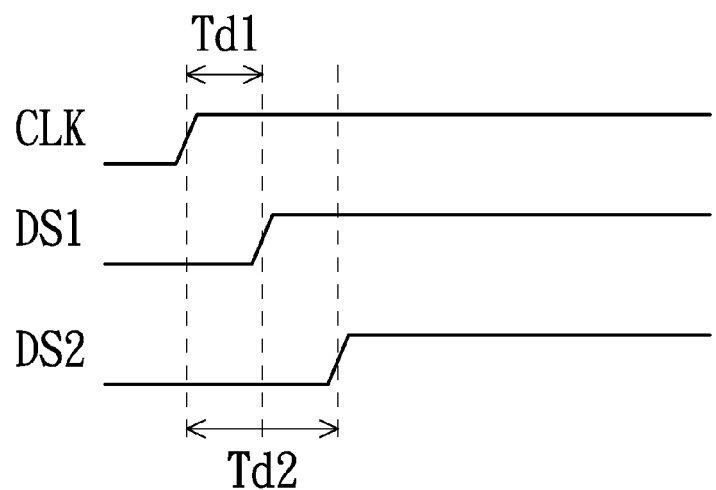
FIG. 4 is a time-sequence view of a clock signal CLK, a delay signal DS1 and a delay signal DS2.

FIG. 4 is a time-sequence view of the clock signal CLK, the delay signal DS1 and the delay signal DS2. As shown in FIG. 4, the delay signal DS1 is delayed for a time of Td1, and the delay signal DS2 is delayed for a time of Td2. That is, the phase of the delay signal DS1 leads the phase of the delay signal DS2. Since the delay degrees of the two delay signals are inversely proportional to the values of the voltages V1 and V2 respectively, it can determine that the voltage V1 is larger than the voltage V2. On the contrary, if the phase of the delay signal DS2 leads the phase of the delay signal DS1, it can determine that the voltage V2 is larger than the voltage V1.

Since each of the delay chains consists of the plurality of inverters, the problem of voltage offsetting will be solved by increasing the number of the inverters of each of the delay chains even if the threshold voltage Vth of a certain transistor is different because of the processing problem. Therefore, compared with the conventional analog sensor amplifier, the problem of voltage offsetting of the sensor amplifier of the present invention is little. In addition, since the inverters of each of the delay chains all employ the circuit structure with small swing, the operation speed of the sense amplifier of the present invention is faster than that of the conventional digital sense amplifier.

Figure 5:
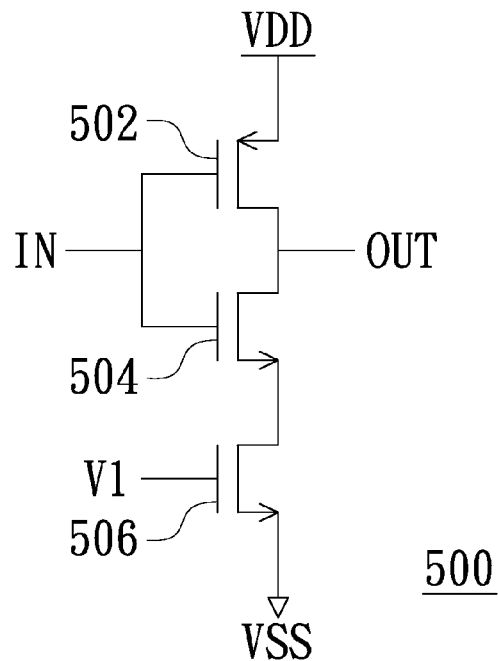
FIG. 5 is a schematic view for showing a circuit structure of an inverter of the delay chain 120 in accordance with another exemplary embodiment of the present invention.

The following will describe another two circuit structures of an inverter with small swing. FIG. 5 is a schematic view for showing a circuit structure of an inverter of the delay chain 120 in accordance with another exemplary embodiment of the present invention. Referring to FIG. 5, the inverter 500 comprises a P-type transistor (as indicated by a label 502) and two N-type transistors (as indicated by labels 504 and 506). A source/drain terminal of the P-type transistor 502 is electrically connected to a power-supply voltage VDD, a gate terminal of the P-type transistor 502 is served as an input terminal of the inverter 500 to receive an input signal IN, and the other source/drain terminal of the P-type transistor 502 is served as an output terminal of the inverter 500 to provide an output signal OUT. A source/drain terminal of the N-type transistor 504 is electrically connected to the other source/drain terminal of the P-type transistor 502, and a gate terminal of the N-type transistor 504 is electrically connected to the gate terminal of the P-type transistor 502. A source/drain terminal of the N-type transistor 506 is electrically connected to the other source/drain terminal of the N-type transistor 504, a gate terminal of the N-type transistor 506 is configured for receiving the voltage V1 (i.e., the voltage on the bit line 102), and the other source/drain terminal of the N-type transistor 506 is electrically connected to a reference voltage VSS.

Figure 6:
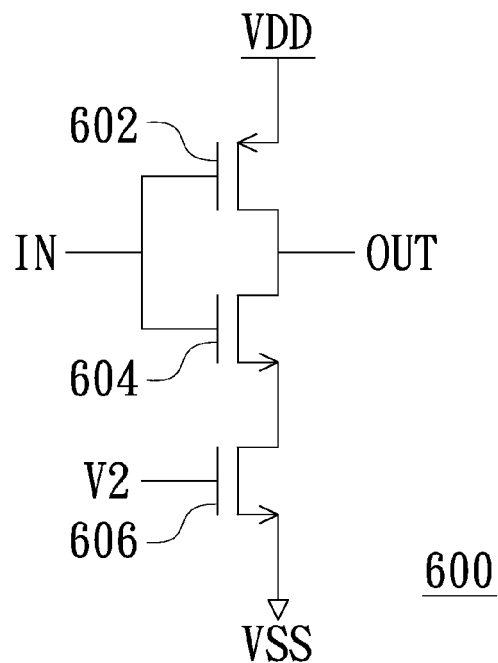
FIG. 6 is a schematic view for showing a circuit structure of an inverter of the delay chain 140 in accordance with another exemplary embodiment of the present invention.

FIG. 6 is a schematic view for showing a circuit structure of an inverter of the delay chain 140 in accordance with another exemplary embodiment of the present invention. Referring to FIG. 6, the inverter 600 also comprises a P-type transistor (as indicated by a label 602) and two N-type transistors (as indicated by labels 604 and 606 respectively). From FIG. 6, it can be seen that the circuit structure of the inverter 600 is similar to that of the inverter 500 except that the gate terminal of the N-type transistor 606 is configured for receiving the voltage V2 (i.e., the voltage on the complementary bit line 104).

Figure 7:
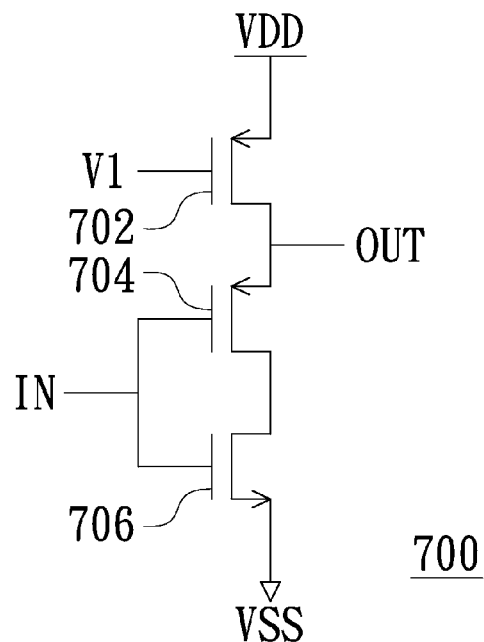
FIG. 7 is a schematic view for showing a circuit structure of an inverter of the delay chain 120 in accordance with still another exemplary embodiment of the present invention.

FIG. 7 is a schematic view for showing a circuit structure of an inverter of the delay chain 120 in accordance with still another exemplary embodiment of the present invention. Referring to FIG. 7, the inverter 700 comprises two P-type transistors (as indicated by labels 702 and 704 respectively) and a N-type transistors (as indicated by a label 706). A source/drain terminal of the P-type transistor 702 is electrically connected to a power-supply voltage VDD, and a gate terminal of the P-type transistor 702 is configured for receiving the voltage V1 (i.e., the voltage on the bit line 102). A source/drain terminal of the P-type transistor 704 is electrically connected to the other source/drain terminal of the P-type transistor 702, a gate terminal of the P-type transistor 704 is served as an input terminal of the inverter 700 to receive an input signal IN, and the other source/drain terminal of the P-type transistor 704 is served as an output terminal of the inverter 700 to provide an output signal OUT. A source/drain terminal of the N-type transistor 706 is electrically connected to the other source/drain terminal of the P-type transistor 704, a gate terminal of the N-type transistor 706 is electrically connected to the gate terminal of the P-type transistor 704, and the other source/drain terminal of the N-type transistor 706 is electrically connected to a reference voltage VSS.

Figure 8:
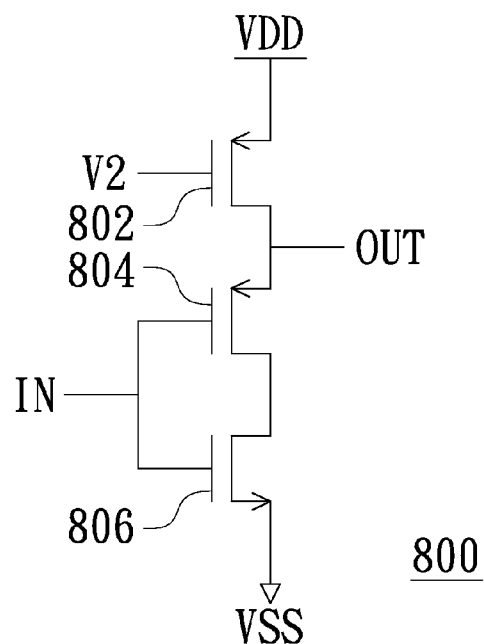
FIG. 8 is a schematic view for showing a circuit structure of an inverter of the delay chain 140 in accordance with still another exemplary embodiment of the present invention.

FIG. 8 is a schematic view for showing a circuit structure of an inverter of the delay chain 140 in accordance with still another exemplary embodiment of the present invention. Referring to FIG. 8, the inverter 800 also comprises two P-type transistors (as indicated by labels 802 and 804 respectively) and a N-type transistor (as indicated by a label 806). From FIG. 8, it can be seen that the circuit structure of the inverter 800 is similar to that of the inverter 700 except that the gate terminal of the P-type transistor 802 of the inverter is configured for receiving the voltage V2 (i.e., the voltage on the complementary bit line 104).

Figure 9:
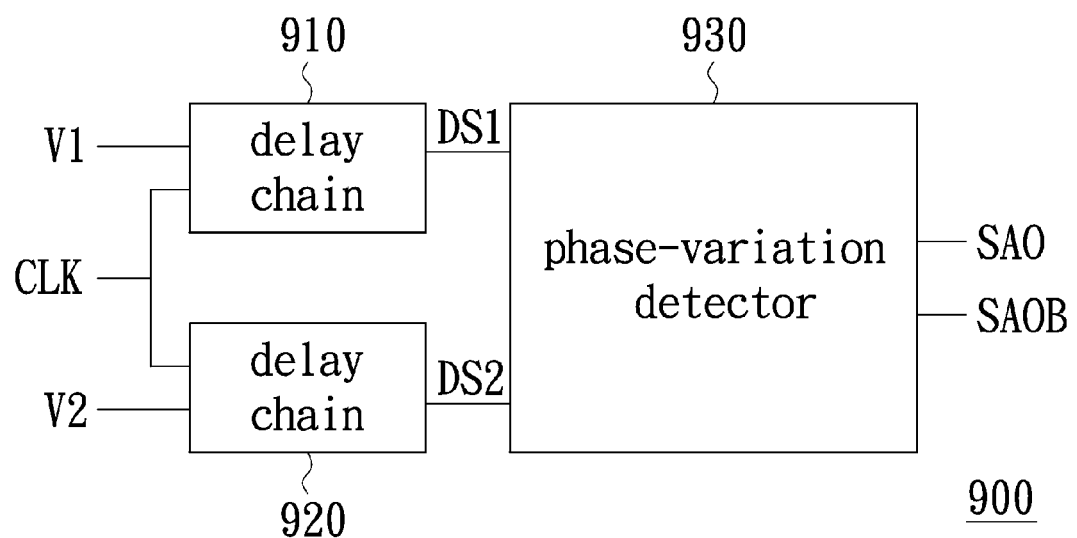
FIG. 9 is a schematic view of a sense amplifier in accordance with another exemplary embodiment of the present invention.

In addition, the sensor amplifier can further adopt a phase-variation detector to enhance the identifying function (as shown in FIG. 9), so that a back-end circuit of the sense amplifier will not mistake which one of the voltage on the bit line 102 and the voltage on the complementary bit line 104 is larger when the delay signal DS1 and the delay signal DS2 are in phase.

FIG. 9 is a schematic view for a sense amplifier in accordance with another exemplary embodiment of the present invention. Referring to FIG. 9, the sense amplifier 900 comprises a delay chain 910, a delay chain 920 and a phase-variation detector 930. The delay chain 910 is configured for delaying the clock signal CLK according to the value of a voltage V1 on a bit line (not shown) and generating a delay signal DS1 accordingly. The delay chain 920 is configured for delaying the clock signal CLK according to the value of a voltage V2 on a complementary bit line (not shown) and generating a delay signal DS2 accordingly. The phase-variation detector 930 has an initial-operation stage and a sensing-operation stage, and the sensing-operation stage is after the initial-operation stage. In the initial-operation stage, the phase-variation detector 930 detects the sequence of the phases of the delay signals DS1 and DS2, so as to generate a first detecting result and store the first detecting result. Therefore, as long as the voltages V1 and V2 are the same in the initial-operation stage, the first detecting result stored in the phase-variation detector 930 will reflect the difference between the charging/discharging speeds of the delay chains 910 and 920.

After storing the first detecting result, the phase-variation detector 930 may enter the sensing-operation stage, and the memory starts operating normally, so that the voltages V1 and V2 can reflect the variations in the voltages on the bit line (not shown) and the complementary bit line (not shown) respectively. In the sensing-operation stage, the phase-variation detector 930 detects the sequence of the phases of the delay signals DS1 and DS2, so as to generate a second detecting result and store the second detecting result. When the second detecting result shows that the delay signals DS1 and DS2 are in phase, the phase-variation detector 930 employs the output signals SAO and SAOB thereof to reflect a result opposite to the first detecting result. When the second detecting result shows that the delay signals DS1 and DS2 are out of phase, the phase-variation detector 930 employs the output signals SAO and SAOB thereof to reflect the second detecting result. This will be described in detail later.

If the first detecting result shows that the delay signal DS2 leads the delay signal DS1, it means that the charging/discharging speed of the delay chain 920 is faster than that of the delay chain 910 when the values of the voltages V1 and V2 are the same. Therefore, when the second detecting result shows that the delay signals DS1 and DS2 are in phase, it means that the actual detecting result is opposite to the first detecting result. Thus, the phase-variation detector 930 will employ the output signals SAO and SAOB to reflect a result opposite to the first detecting result. That is, the output signals SAO and SAOB will be used to reflect the result that the delay signal DS1 leads the delay signal DS2. When the second detecting result shows that the delay signals DS1 and DS2 are out of phase, it means that the actual detecting result is the same as the second detecting result. Thus, the phase-variation detector 930 will employ the output signals SAO and SAOB to reflect the second detecting result.

Figure 10:
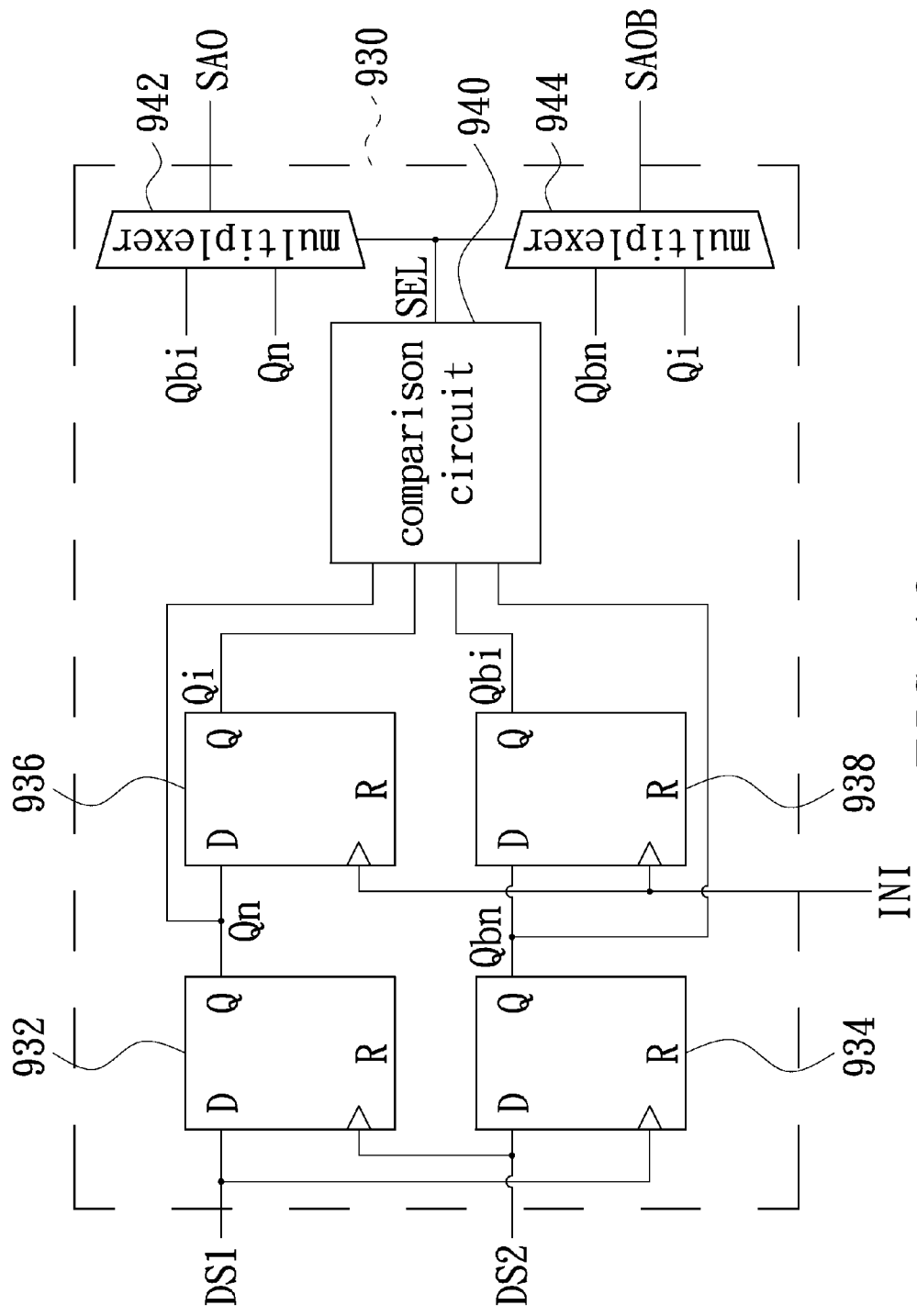
FIG. 10 is a schematic view of a phase-variation detector 930 in accordance with an exemplary embodiment of the present invention.

FIG. 10 is a schematic view of the phase-variation detector 930 in accordance with an exemplary embodiment of the present invention. Referring to FIG. 10, the phase-variation detector 930 comprises four D-type flip-flops (as indicated by labels 932, 934, 936 and 938 respectively), a comparison circuit (as indicated by a label 940) and two multiplexers (as indicated by labels 942 and 944 respectively). Each of the D-type flip-flops comprises a data-input terminal (as indicated by D), a data-output terminal (as indicated by Q) and a clock-input terminal (as indicated by triangle). The data-input terminal D of the D-type flip-flop 932 is configured for receiving the delay signal DS1, and the clock-input terminal of the D-type flip-flop 932 is configured for receiving the delay signal DS2. The data-input terminal D of the D-type flip-flop 934 is configured for receiving the delay signal DS2, and the clock-input terminal of the D-type flip-flop 934 is configured for receiving the delay signal DS1. The data-input terminal D of the D-type flip-flop 936 is configured for receiving a signal Qn outputted from the data-output terminal Q of the D-type flip-flop 932, and the clock-input terminal of the D-type flip-flop 936 is configured for receiving an initial-setting signal INI. The initial-setting signal INI is configured for determining whether the phase-variation detector 930 is in the initial-operation stage or the sensing-operation stage. The data-input terminal D of the D-type flip-flop 938 is configure for receiving a signal Qbn outputted from the data-output terminal Q of the D-type flip-flop 934, and the clock-input terminal of the D-type flip-flop 938 is configured for receiving the initial-setting signal INI.

In addition, the multiplexer 942 is configured for receiving the signals Qn and Qbi and outputting one of the signals Qn and Qbi according to a selecting signal SEL. The multiplexer 944 is configured for receiving the signals Qbn and Qi and outputting one of the signals Qbn and Qi according to the selecting signal SEL. The comparison circuit 940 is configured for receiving the signals Qn, Qbn, Qi and Qbi, and the comparison circuit 940 is configured for comparing the signals Qn and Qbn and determining whether the signals Qn and Qbn are in phase, so as to output the selecting signal SEL accordingly. When the comparing result is positive, the comparison circuit 940 employs the selecting signal SEL to control the multiplexers 942 and 944 to output the signals Qbi and Qi respectively, so that the signals Qbi and Qi will be served as the output signals SAO and SAOB of the phase-variation detector 930 respectively and be used to reflect the result opposite to the first detecting result. When the comparing result is negative, the comparing result 940 employs the selecting signal SEL to control the multiplexers 942 and 944 to output the signals Qn and Qbn respectively, so that the signals Qn and Qbn will be served as the output signals SAO and SAOB of the phase-variation detector 930 respectively and be used to reflect the second detecting result.

Figure 11:
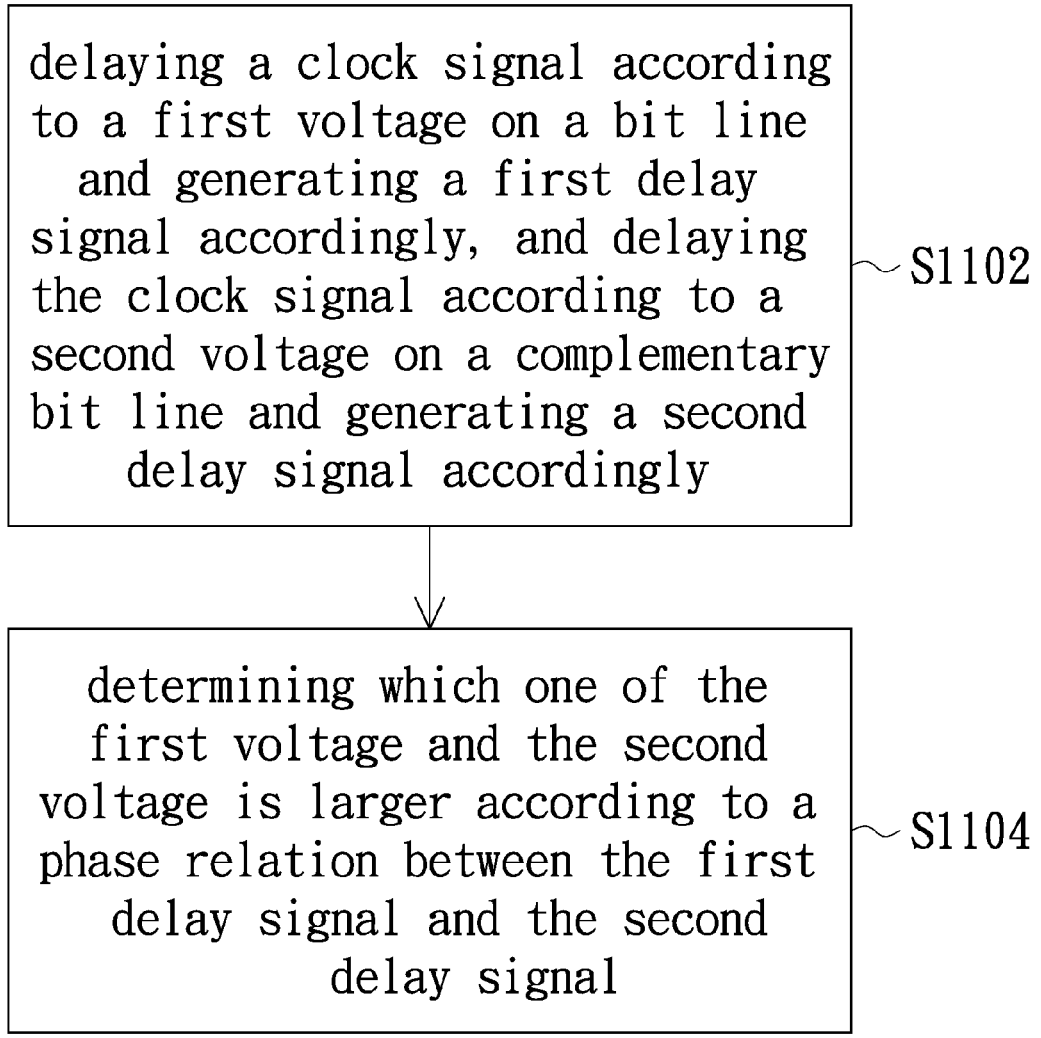
FIG. 11 is a flow chart of a method for determining the values of the voltages on a bit-line pair in accordance with an exemplary embodiment of the present invention.

From the above, a method for determining the values of the voltages on a bit-line pair can be concluded, which is as shown in FIG. 11. Referring to FIG. 11, the method comprises the following steps: delaying a clock signal according to a first voltage on a bit line and generating a first delay signal accordingly, and delaying the clock signal according to a second voltage on a complementary bit line and generating a second delay signal accordingly (as shown in Step S1102); and determining which one of the first voltage and the second voltage is larger according to a phase relation between the first delay signal and the second delay signal (as shown in Step S1104).

The voltage-determining method further comprises: determining the first voltage is larger than the second voltage when determining the phase of the first delay signal leads that of the second delay signal; and determining the second voltage is larger than the first voltage when determining the phase of the second delay signal leads that of the first delay signal.

In summary, the present invention employs two delay chains to convert the values of the voltages on a bit line and a complementary bit lines into phase delays. Therefore, a user can determine which one of the voltages on the bit line and the complementary bit line is larger according to the phase relation between the first delay signal and the second delay signal. The larger the voltage is, the smaller the delay is. Thus, when the phase of the first delay signal leads that of the second delay signal, it can determine that the voltage on the bit line is larger than the voltage on the complementary bit line. On the contrary, when the phase of the second delay signal leads that of the first delay signal, it can determine that the voltage of the complementary bit line is larger than the voltage on the bit line.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A sense amplifier, comprising:
 a first delay chain, electrically connected to a bit line and configured for receiving a clock signal and a first voltage on the bit line, so as to delay the clock signal according to the first voltage and to generate a first delay signal accordingly; and
 a second delay chain, electrically connected to a complementary bit line and configured for receiving the clock signal and a second voltage on the complementary bit line, so as to delay the clock signal according to the second voltage and to generate a second delay signal accordingly.

2. The sense amplifier according to claim 1, wherein each of the first delay chain and the second delay chain comprises even inverters.

3. The sense amplifier according to claim 2, wherein each of the inverters of the first delay chain comprises:

a first P-type transistor, a source/drain terminal thereof being electrically connected to a power-supply voltage, and a gate terminal thereof being configured for receiving a read-enable signal;
 a second P-type transistor, a source/drain terminal thereof being electrically connected to the other source/drain terminal of the first P-type transistor, a gate terminal thereof being served as an input terminal of the inverter, and the other source/drain terminal thereof being served as an output terminal of the inverter;
 a first N-type transistor, a source/drain terminal thereof being electrically connected to the other source/drain terminal of the second P-type transistor, and a gate terminal thereof being electrically connected to the gate terminal of the second P-type transistor; and
 a second N-type transistor, a source/drain terminal thereof being electrically connected to the other source/drain terminal of the first N-type transistor, a gate terminal thereof being configured for receiving the first voltage, and the other source/drain terminal thereof being electrically connected to a reference voltage.

4. The sense amplifier according to claim 3, wherein each of the inverters of the second delay chain comprises:

a first P-type transistor, a source/drain terminal thereof being electrically connected to the power-supply voltage, and a gate terminal thereof being configured for receiving the read-enable signal;
 a second P-type transistor, a source/drain terminal thereof being electrically connected to the other source/drain terminal of the first P-type transistor, a gate terminal thereof being served as an input terminal of the inverter, and the other source/drain terminal thereof being served as an output terminal of the inverter;
 a first N-type transistor, a source/drain terminal thereof being electrically connected to the other source/drain terminal of the second P-type transistor, a gate terminal thereof being electrically connected to the gate terminal of the second P-type transistor; and
 a second N-type transistor, a source/drain terminal thereof being electrically connected to the other source/drain terminal of the first N-type transistor, a gate terminal thereof being configured for receiving the second voltage, and the other source/drain terminal thereof being electrically connected to the reference voltage.

5. The sense amplifier according to claim 2, wherein each of the inverters of the first delay chain comprises:

a P-type transistor, a source/drain terminal thereof being electrically connected to a power-supply voltage, a gate terminal thereof being served as an input terminal of the inverter, and the other source/drain terminal thereof being served as an output terminal of the inverter;
 a first N-type transistor, a source/drain terminal thereof being electrically connected to the other source/drain terminal of the P-type transistor, and a gate terminal thereof being electrically connected to the gate terminal of the P-type transistor; and
 a second N-type transistor, a source/drain terminal thereof being electrically connected to the other source/drain terminal of the first N-type transistor, a gate terminal thereof being configured for receiving the first voltage, and the other source/drain terminal thereof being electrically connected to a reference voltage.

6. The sense amplifier according to claim 5, wherein each of the inverter of the second delay chain comprises:

a P-type transistor, a source/drain terminal thereof being electrically connected to the power-supply voltage, a gate terminal thereof being served as an input terminal of the inverter, and the other source/drain terminal thereof being served as an output terminal of the inverter;

a first N-type transistor, a source/drain terminal thereof being electrically connected to the other source/drain terminal of the P-type transistor, and a gate terminal thereof being electrically connected to the gate terminal of the P-type transistor; and a second N-type transistor, a source/drain terminal thereof being electrically connected to the other source/drain terminal of the first N-type transistor, a gate terminal thereof being configured for receiving the second voltage, and the other source/drain terminal thereof being electrically connected to the reference voltage.

7. The sense amplifier according to claim 2, wherein each of the inverters of the first delay chain comprises:

a first P-type transistor, a source/drain terminal thereof being electrically connected a power-supply voltage, and a gate terminal thereof being configured for receiving the first voltage;

a second P-type transistor, a source/drain terminal thereof being electrically connected to the other source/drain terminal of the first P-type transistor, a gate terminal thereof being served as an input terminal of the inverter, and the other source/drain terminal thereof being served as an output terminal of the inverter; and a N-type transistor, a source/drain terminal thereof being electrically connected to the other source/drain terminal of the second P-type transistor, a gate terminal thereof being electrically connected to the gate terminal of the second P-type transistor, and the other source/drain terminal thereof being electrically connected to a reference voltage.

8. The sense amplifier according to claim 7, wherein each of the inverters of the second delay chain comprises:

a first P-type transistor, a source/drain terminal thereof being electrically connected to a power-supply voltage, and a gate terminal thereof being configured for receiving the second voltage;

a second P-type transistor, a source/drain terminal thereof being electrically connected to the other source/drain terminal of the first P-type transistor, a gate terminal thereof being served as an input terminal of the inverter, and the other source/drain terminal thereof being served as an output terminal of the inverter; and a N-type transistor, a source/drain terminal thereof being electrically connected to the other source/drain terminal of the second P-type transistor, a gate terminal thereof being electrically connected to the gate terminal of the second P-type transistor, and the other source/drain terminal thereof being electrically connected to the reference voltage.

9. The sense amplifier according to claim 2, further comprising a phase-variation detector, wherein the phase-variation detector has an initial-operation stage and a sensing-operation stage, the sensing-operation stage is after the initial-operation stage; in the initial-operation stage, the phase-variation detector detects a sequence of phases of the first delay signal and the second delay signal, so as to generate a first detecting result and store the first detecting result; in the sensing-operation stage, the phase-variation detector detects a sequence of phases of the first delay signal and the second delay signal, so as to generate a second detecting result and store the second detecting result; when the second detecting result shows that the first delay signal and the second delay signal are in phase, the phase-variation detector outputs a result opposite to the first detecting result; when the second detecting result shows that the first delay signal and the second delay signal are out of phase, the phase-variation detector outputs the second detecting result.

10. The sense amplifier according to claim 9, wherein the phase-variation detector comprises:

a first D-type flip-flop, having a first data-input terminal, a first data-output terminal and a first clock-input terminal, the first data-input terminal being configured for receiving the first delay signal, and the first clock-input terminal being configured for receiving the second delay signal;

a second D-type flip-flop, having a second data-input terminal, a second data-output terminal and a second clock-input terminal, the second data-input terminal being configured for receiving the second delay signal, and the second clock-input terminal being configured for receiving the first delay signal;

a third D-type flip-flop, having a third data-input terminal, a third data-output terminal and a third clock-input terminal, the third data-input terminal being configured for receiving a signal outputted from the first data-output terminal, the third clock-input terminal being configured for receiving an initial-setting signal, and the initial-setting signal being configured for determining whether the phase-variation detector is in the initial-operation stage or the sensing-operation stage;

a fourth D-type flip-flop, having a fourth data-input terminal, a fourth data-output terminal and a fourth clock-input terminal, the fourth data-input terminal being configured for receiving a signal outputted from the second data-output terminal, and the fourth clock-input terminal being configured for receiving the initial-setting signal;

a first multiplexer, configured for receiving the signal outputted from the first data-output terminal and a signal outputted from the fourth data-output terminal, and outputting one of the signal outputted from the first data-output terminal and the signal outputted from the fourth data-output terminal according to a selecting signal;

a second multiplexer, configured for receiving the signal outputted from the second data-output terminal and a signal outputted from a third data-output terminal, and outputting one of the signal outputted from the second data-output terminal and the signal outputted from the third data-output terminal according to the selecting signal; and a comparison circuit, configured for receiving the signal outputted from the first data-output terminal, the signal outputted from the second data-output terminal, the signal outputted from the third data-output terminal and the signal outputted from the fourth data-output terminal, and comparing whether the signal outputted from the first data-output terminal and the signal outputted from the second data-output terminal are in phase, so as to output the selecting signal accordingly; wherein when a comparing result thereof is positive, the comparison circuit employs the selecting signal to control the first multiplexer and the second multiplexer to output the signal outputted from the fourth data-output terminal and the signal outputted from the third data-output terminal respectively to serve as a result opposite to the first detecting result; when the comparing result is negative, the comparison circuit employs the selecting signal to control the first multiplexer and the second multiplexer to output the signal outputted from the first data-output terminal and the signal outputted from the second data-output terminal to serve as the second detecting result.

11. A method for determining the values of the voltages on a bit-line pair, comprising:
- delaying a clock signal according to a first voltage on a bit line and generating a first delay signal accordingly, and delaying the clock signal according to a second voltage on a complementary bit line and generating a second delay signal accordingly; and
- determining which one of the first voltage and the second voltage is larger according to a phase relation between the first delay signal and the second delay signal.

12. The method according to claim 11, wherein it determines that the first voltage is larger than the second voltage when a determining result shows that a phase of the first delay chain leads that of the second delay chain; and it determines that the second voltage is larger than the first voltage when the determining result shows that the phase of the second delay chain leads that of the first delay chain.

* * * * *